(12) United States Patent
Boe

(10) Patent No.: US 9,496,798 B2
(45) Date of Patent: *Nov. 15, 2016

(54) VARIABLE SPEED DRIVE FOR SUBSEA APPLICATIONS

(71) Applicant: Siemens Aktiengesellschaft, Munich (DE)

(72) Inventor: Ove Boe, Tanem (NO)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

This patent is subject to a terminal disclaimer.

(21) Appl. No.: 14/645,706

(22) Filed: Mar. 12, 2015

(65) Prior Publication Data
US 2015/0188444 A1 Jul. 2, 2015

Related U.S. Application Data

(63) Continuation of application No. 12/513,474, filed as application No. PCT/EP2006/010614 on Nov. 6, 2006.

(51) Int. Cl.
*H02M 5/45* (2006.01)
*B63G 8/08* (2006.01)
*H02P 27/06* (2006.01)
*H05K 7/20* (2006.01)
(Continued)

(52) U.S. Cl.
CPC ............... *H02M 5/45* (2013.01); *B63G 8/08* (2013.01); *E21B 43/01* (2013.01); *H02P 27/06* (2013.01); *H05K 7/20236* (2013.01); *H05K 7/20927* (2013.01); *B63G 8/36* (2013.01); *B63H 23/24* (2013.01)

(58) Field of Classification Search
CPC .................................................... H02M 5/45
USPC .......... 363/35, 37, 55, 56.01, 56.04, 57, 58, 363/71, 95–99, 131–132; 323/259, 263, 323/344; 361/71, 74; 307/149; 405/154.1, 405/75, 76, 195.1, 210, 211, 114, 257; 439/201, 207, 208; 114/331, 337, 312, 114/314

See application file for complete search history.

(56) References Cited

U.S. PATENT DOCUMENTS

| 4,137,489 A | 1/1979 | Lipo | 318/798 |
| 4,399,501 A | 8/1983 | Masselin | 363/141 |

(Continued)

FOREIGN PATENT DOCUMENTS

| CN | 1543414 A | 11/2004 | B62H 21/17 |
| DE | 3026881 A1 | 2/1982 | H05K 5/06 |

(Continued)

OTHER PUBLICATIONS

International Search Report and Written Opinion, PCT/EP2006/010614, 9 pages, Jun. 29, 2007.

*Primary Examiner* — Adolf Berhane
*Assistant Examiner* — Nusrat Quddus
(74) *Attorney, Agent, or Firm* — Slayden Grubert Beard PLLC

(57) ABSTRACT

A Variable Speed Drive (1) for subsea installations (20), subsea vessels or subsea vehicles, as well as to a corresponding subsea installation (20), subsea vessel or subsea vehicle, has an alternating current/alternating current converter (2) having a current-controlled capacitor-less direct current link (7).

19 Claims, 2 Drawing Sheets

(51) Int. Cl.
*E21B 43/01* (2006.01)
*H02M 5/453* (2006.01)
*B63G 8/36* (2006.01)
*B63H 23/24* (2006.01)

(56) References Cited

U.S. PATENT DOCUMENTS

| | | | |
|---|---|---|---|
| 5,293,070 A | 3/1994 | Burgess et al. | 257/714 |
| 5,338,435 A | 8/1994 | Betts et al. | 204/406 |
| 5,544,035 A | 8/1996 | Beriger et al. | 363/132 |
| 5,768,114 A | 6/1998 | Gruning et al. | 363/58 |
| 5,986,906 A | 11/1999 | Ramezani et al. | 363/58 |
| 6,636,431 B2 | 10/2003 | Seki et al. | 363/65 |
| 7,773,375 B1 | 8/2010 | Faucett | 361/679.49 |
| 9,056,663 B2 | 6/2015 | Bø | 363/35 |
| 2006/0268587 A1 | 11/2006 | Veenstra | 363/37 |
| 2010/0031670 A1 | 2/2010 | Hoffman et al. | 60/793 |
| 2011/0038193 A1 | 2/2011 | Jacobson et al. | 363/131 |

FOREIGN PATENT DOCUMENTS

| | | | | |
|---|---|---|---|---|
| DE | 3831610 A1 | 3/1990 | | H05K 7/20 |
| GB | 2381137 B | 3/2004 | | G01V 3/12 |
| JP | 60219892 A | 11/1985 | | G10K 11/00 |
| JP | 2004139848 A | 5/2004 | | H01B 7/14 |
| WO | 02/102659 A1 | 12/2002 | | B63H 21/17 |

VARIABLE SPEED DRIVE FOR SUBSEA APPLICATIONS

CROSS-REFERENCE TO RELATED APPLICATIONS

This application is a continuation of U.S. patent application Ser. No. 12/513,474 filed May 4, 2009, which is a U.S. National Stage Application of International Application No. PCT/EP2006/010614 filed Nov. 6, 2006, which designates the United States of America. The contents of which are hereby incorporated by reference in their entirety.

TECHNICAL FIELD

The invention relates to a subsea installation with a Variable Speed Drive (VSD). Furthermore, it relates to subsea applications such as subsea vessels and subsea vehicles with such subsea installation.

BACKGROUND

Adjustable speed ac induction motor drive is known from U.S. Pat. No. 4,137,489 and makes use of a common voltage converter for applying a voltage of variable magnitude to a dc link and a polyphase current source inverter having a variable frequency output with the dc link current magnitude.

As far as the invention is concerned, subsea installations, vessels and vehicles are usually used in exploring and exploiting gas and oil fields at wellheads located at the seabed. Variable Speed Drives are used in this context for applications requiring translatory or rotational movements by electric motors.

Prior art Variable Speed Drives for such subsea installations, vessels and vehicles make use of common voltage-controlled alternating current/alternating current (AC/AC) converters based on insulated gate bipolar transistors (IGBT), the converters comprising a rectifier, a direct current (DC) link buffered by a capacitor bank, and an inverter.

Disadvantageously, capacitors are sensitive to environment pressure. Prior art subsea applications therefore have to provide pressure compensation with an internal air pressure equal to the atmospheric standard pressure of approximately 1013 hPa (1 atm). Typically, the alternating current/alternating current converter and its control electronics are placed in a special housing to keep the pressure-compensated volume small. Only the interior of the housing has to be kept at the atmospheric standard pressure then. As this housing has to be pressure-resistant against the overpressure of the subsea environment or of a surrounding main vessel, several constructional problems occur. Securely withstanding the pressure requires thick walls (up to more than 100 mm depending on pressure and dimensions of the housing) and/or support rods, which takes much space, and poses high prerequisites regarding the sealing of the housing, in particular regarding penetrators for electrical connections into and out of the housing. Additionally, the converter circuits need a complex cooling system to dissipate waste heat from within their housing.

SUMMARY

According to various embodiments, a subsea installation can be specified with a variable speed drive of the type initially mentioned, having lower constructional requirements. According to further embodiments a corresponding subsea vessel and subsea vehicle can be specified.

According to an embodiment, a subsea installation may comprise a Variable Speed Drive with an alternating current/alternating current converter having a current-controlled capacitor-less direct current link, wherein at least the converter is arranged within a liquid-tight housing. According to a further embodiment, the direct current link may comprise a smoothing inductor. According to a further embodiment, the direct current link may consist of the inductor only. According to a further embodiment, the housing can be filled with an electrically isolating liquid. According to a further embodiment, a wall of the housing may have a thickness of maximally 10 mm. According to a further embodiment, a volume compensator can be located on the housing. According to a further embodiment, the housing may be arranged within a liquid-tight main vessel. According to a further embodiment, the main vessel may be at least partially filled with an electrically isolating liquid. According to a further embodiment, the converter may comprise a thyristor-controlled rectifier and a thyristor-controlled line-commutated inverter.

According to another embodiment, a subsea vessel may comprise such a subsea installation with a Variable Speed Drive as described above.

According to yet another embodiment, a subsea vehicle may comprise such a subsea installation with a Variable Speed Drive as described above.

BRIEF DESCRIPTION OF THE DRAWINGS

In the following, exemplary embodiments of the invention are explained in further detail with drawings.

In the drawings.

Like parts are denoted by like reference signs in all figures.

DETAILED DESCRIPTION

Figure 1:
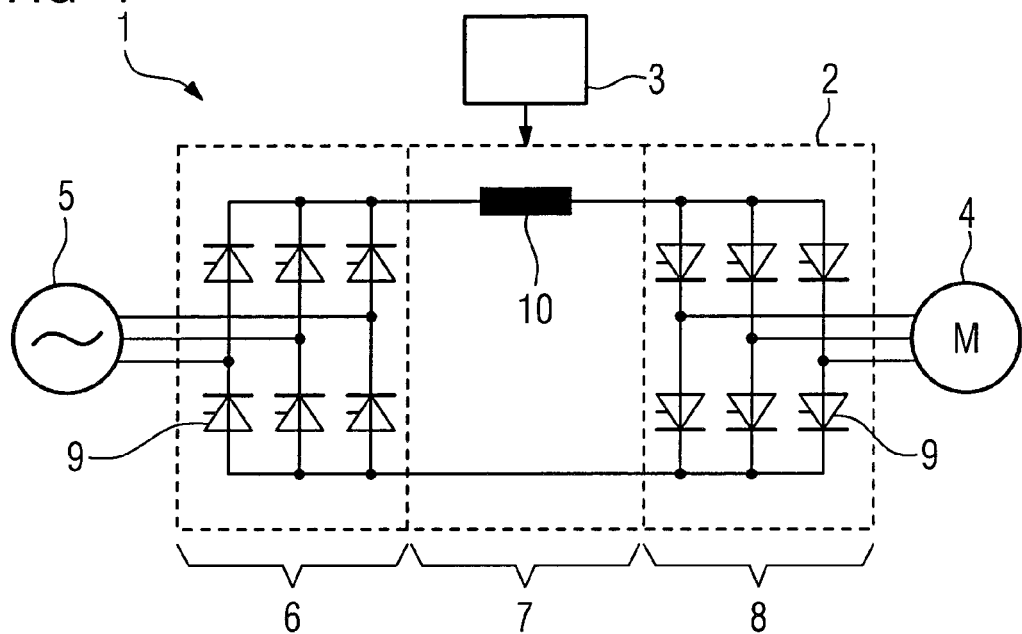
FIG. 1 shows a circuit diagram of a variable speed drive.

According to various embodiments, a subsea installation with a variable speed drive comprises an alternating current/alternating current converter having a current-controlled capacitor-less direct current link. This not only reduces the number of electronic components in the converter, hence reducing the probability of failure. Moreover, complex measures for pressure compensation can be completely omitted or can at least be limited to the control electronics of the converter, as according to various embodiments no pressure-sensitive capacitors are used. The converter can be exposed to overpressure therefore, in particular to subsea environmental pressure. The converter can be equipped with any kind of power switches, such as thyristors, metal oxide semiconductor field effect transistors (MOSFET) and insulated gate bipolar transistors.

Preferably, said direct current link comprises a smoothing inductor. A smoothing inductor is typically used for high-power current-controlled direct current links. The direct current link may comprise other pressure-proof components.

Particularly, said direct current link may consist of said inductor only. This way, the variable speed drive has a simple design and a low failure probability and takes only little space.

In a preferred embodiment, at least said converter is arranged within a liquid-tight housing. This housing is preferably filled with a liquid. As liquids are nearly incompressible the liquid serves for supporting the housing on all sides against any external pressure. As a consequence, the housing itself is nearly incompressible even at a high external pressure such as in the deep sea, and the converter components are indirectly exposed to the external pressure. For this reasons, the construction complexity of the housing can be significantly reduced. The seals and fittings, in particular of penetrators, can be simpler and are considerably more reliable due to low differential pressure between inside and outside of the housing. Additionally, the liquid can serve as a coolant for dissipating waste heat from the converter circuits to the outside of the housing. The complexity of a cooling system is therefore reduced, too. Because the constructional requirements are lower than in prior art, compact and lightweight Variable Speed Drives are possible by this embodiment.

Advantageously, said housing is filled with an electrically isolating liquid. In this case, no precautions have to be taken against short circuits between bare electrical contacts of the converter. For example, the liquid can be oil.

Preferably, a wall of said housing has a thickness of maximally 10 mm, in particular of maximally 5 mm. Therefore, the housing has a low heat capacity, but a high heat conductance for efficiently dissipating waste heat. Besides, it needs less material, and less space in the subsea application. Generally, the walls of said housing only need to have a thickness designed to withstand normal handling and operation conditions.

Malfunction due to a leakage can be retarded by a volume compensator that is located inside of said housing. The volume compensator prevents external liquids from intruding into the converter housing for a certain period of time by providing a slight overpressure inside the housing.

In one possible embodiment, said housing is arranged within a liquid-tight main vessel. Other parts of the subsea application can be arranged in the main vessel. In this embodiment, the converter is contained in the housing independently from such parts and from the internal pressure of the main vessel. In particular, the main vessel can be filled with a liquid, hence applying the pressure-resistant principle of the converter housing to the main vessel, too. The main vessel can thus have a reduced construction complexity as the nearly incompressible liquid serves for supporting the main vessel on all sides. It is possible to locate the control electronics of the converter in a small pressure-compensated containment inside or outside of the main vessel. In particular, this pressure-compensated containment can be arranged inside the converter housing.

Preferably, said main vessel is at least partially filled with an electrically isolating liquid, for example, oil. The main vessel may comprise bare electrical contacts in its interior as described above for the housing of the converter, so short circuits are avoided this way. Besides, in case of a leakage of the housing, the liquid of the main vessel may enter the housing without electrically influencing the operation of the converter.

In a special embodiment, said converter comprises a thyristor-controlled rectifier and a thyristor-controlled line-commutated inverter. Instead of thyristors, it may comprise arbitrary other semiconductor valves. This allows for operating a synchronous machine using the Variable Speed Drive.

In addition, other embodiments comprise a subsea installation, a subsea vessel and a subsea vehicle comprising a Variable Speed Drive as described above.

FIG. 1 shows a sample circuit diagram of a variable speed drive 1 for a subsea installation (not shown in this figure) according to various embodiments. It comprises a three-phase alternating current/alternating current converter 2, control electronics 3 and an asynchronous induction motor 4. The input of the converter 2 is connected to a three-phase voltage source 5. The converter 2 supplies the motor 4 with a pulsed three-phase alternating current.

The converter 2 comprises a rectifier 6, a direct current link 7 and an inverter 8. The exemplary rectifier 6 is a full wave three-phase bridge rectifier comprising six thyristors 9. The exemplary direct current link 7 is current-controlled and comprises only a smoothing inductor 10, but no capacitors. The exemplary inverter 8 comprises six thyristors 9, serving for creating pulse-width modulated output waveforms that cause a sinusoidal current in the motor 4. The pulse-width modulation is performed by the control electronics 3. Any algorithm for generating the output waveforms can be used by the control electronics 3, for example, space vector modulation.

The converter 2 can be exposed directly or indirectly to a pressure significantly higher or lower than 1013 hPa without influencing its function, because no pressure-sensitive capacitors are used.

In another embodiment (not shown), the converter 2 may be contained in a liquid-tight housing that is filled with an electrically isolating liquid. It supports the housing on all sides against any external pressure. Hence, the differential pressure between the interior of the housing and the exterior is negligible. As a consequence, the complete design of the converter 2 is insensitive to leakages, because the probability of an external medium intruding into it is strongly limited. Hence, the converter 2 has a high reliability at low production costs.

Figure 2:
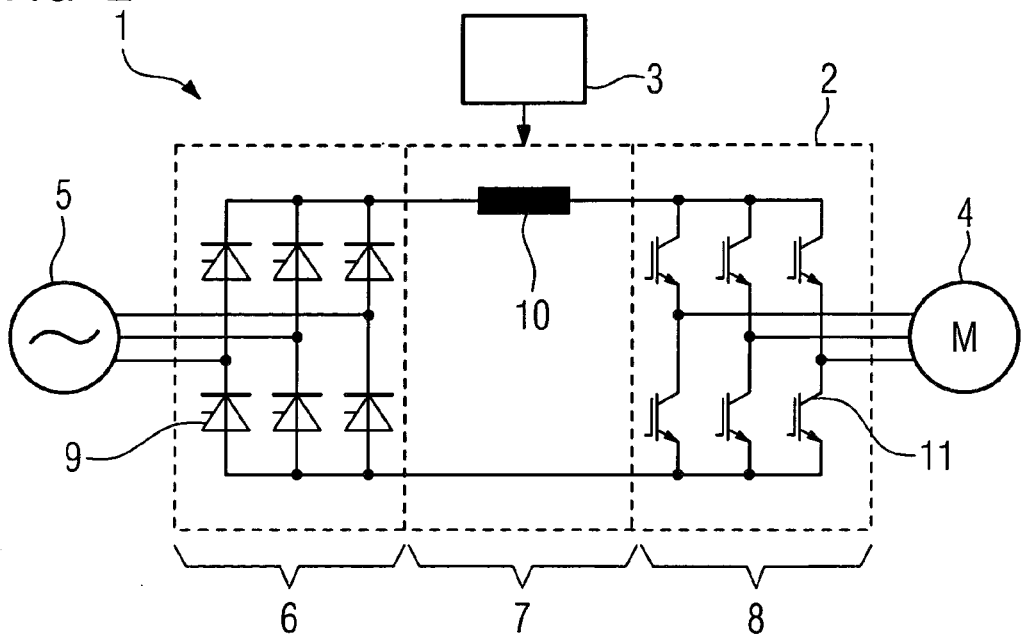
FIG. 2 shows a circuit diagram of another variable speed drive.

FIG. 2 shows a sample circuit diagram of another Variable Speed Drive 1 according to various embodiments. It is built similar to the one of FIG. 1. However, the inverter 8 comprises six insulated gate bipolar transistors 11 instead of thyristors, and the motor 4 is a synchronous machine. Using insulated gate bipolar transistors 11 allows for applying other modulation patterns for the inverter 8. The ability to switch off the current at desired times enables the converter 2 to drive other kinds of motors and loads than synchronous machines, too.

Figure 3:
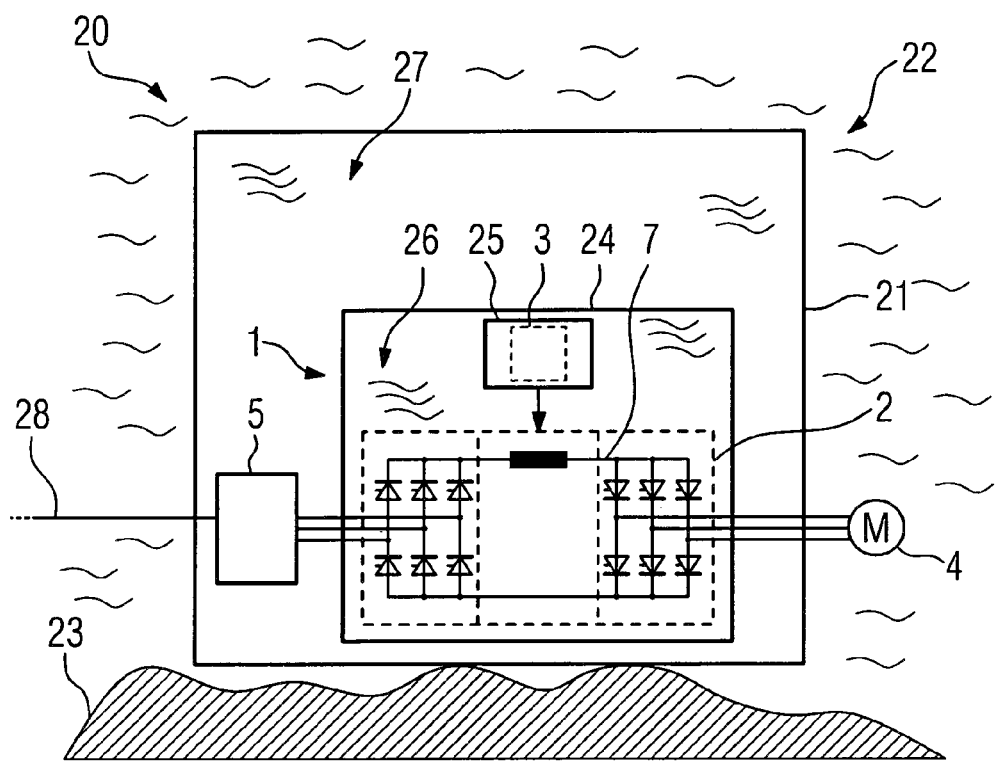
FIG. 3 shows a subsea installation.

In FIG. 3, an example of a subsea installation 20 is depicted. It comprises a liquid-tight main vessel 21 surrounded by seawater 22 and located at the seabed 23. The subsea installation 20 is part of a wellhead for drilling (not shown) into the seabed 23. A liquid-tight housing 24 for a converter 2 of a variable speed drive 1 is arranged inside the main vessel 21. The converter 2 is located inside the housing 24. The control electronics 3 of the converter 2 are located inside a separate air-filled and pressure-compensated containment 25 that is located, for example, inside the converter housing 24. The housing 24 is filled with an electrically isolating first liquid 26. The main vessel 21 is filled with an electrically isolating second liquid 27. Both liquids 26, 27 are oils.

The subsea installation 20 is connected to a subsea power line 28 providing it with electrical energy in the form of a 10 kV three-phase alternating current. The power line voltage is transformed to a 240 V three-phase installation voltage to which the input of the converter 2 of the variable speed drive 1 is connected, wherein the transformer can be seen as a voltage source 5. The converter 2 is designed as the one described in FIG. 1. However, in other embodiments (not shown) it may be any kind of alternating current/alternating current converter comprising a current-controlled capacitor-less direct current link. The converter 2 outputs a 3 kV (root mean square value) three-phase pulse-width modulated alternating current to a drilling motor 4.

The voltages given above just describe an exemplary subsea installation 20. Other voltages may apply depending on the length of the power line 28, the distance from the voltage source 5 to the converter 2, and the required voltage and power of the motor 4, respectively. If appropriate, the transformer can be omitted.

Both liquids 26, 27 serve as coolants for the respective electronic components. The waste heat rising at the converter 2 inside the housing 24 is dissipated via the first liquid 26 to and through the housing 24. From there, it is dissipated via the second liquid 27 to and through the main vessel 21 and, finally, to the seawater 22. For this purpose, a circle flow of the first liquid 26 can be created inside the housing 24, either by the force of gravity or by at least one dedicated pump (not shown). In the same way, a circle flow of the second liquid 27 can be created inside the main vessel 21. Heat exchanging devices may be arranged in the first liquid 26 and/or in the second liquid 27 to increase efficiency, wherein one liquid 26, 27 is extensively conducted through the other 27, 26 without merging them.

The liquids 26, 27 support the housing 24 and the main vessel 21, respectively, on all sides against the external subsea overpressure. Due to this, the differential pressures between the interior of the subsea installation 20, i.e. inside the housing 24 and inside the main vessel 21, and the surrounding seawater 22 is negligible. The seals and fittings (not shown), in particular of penetrators, of the housing 24 and of the main vessel 21 can therefore be designed for a low differential pressure. In the subsea installation 20 the intrusion of seawater into the converter 2 even is nearly impossible, because the housing 24 is located within the main vessel 21. In case of a leakage of the main vessel 21 no seawater will enter the housing 24. In case of a leakage of the housing 24 only, the second liquid 27 of the main vessel 21 can enter the housing 24. However, it will not lead to malfunction of the converter 2, as might be the case for seawater 22 directly intruding into the converter 2, because the second liquid 27 is electrically isolating. Thus, the subsea installation 20 will maintain operation. Due to these reasons, the Variable Speed Drive 1 is applicable to a wide range of power and voltage.

In other embodiments (not shown), the variable speed drive 1 can be used for driving a pump motor 4 or any other kind of motor 4.

Figure 4:
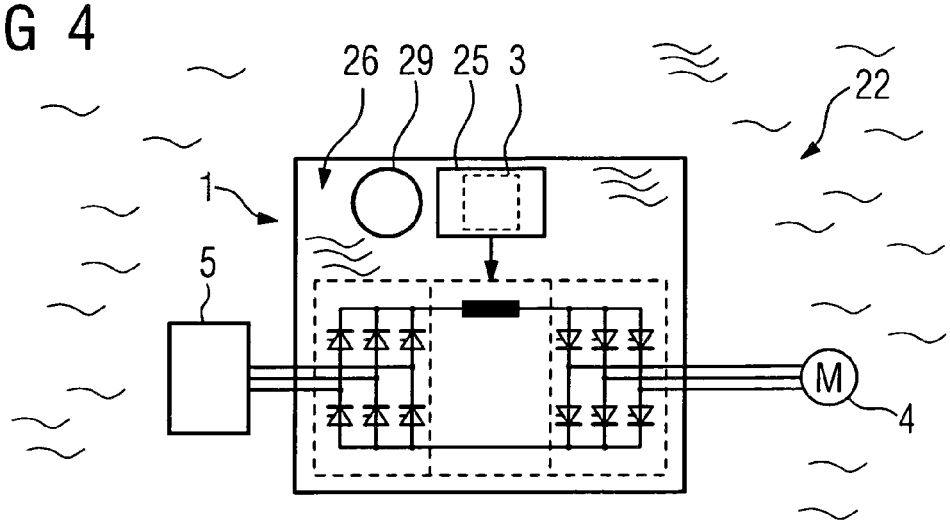
FIG. 4 shows a typical application of a Variable Speed Drive 1 in a subsea installation.

FIG. 4 shows a typical application of a Variable Speed Drive 1 in a subsea installation (not shown). The motor 4 and driven equipment are located apart from the converter 2 that is arranged in a single liquid-tight housing 24 filled with a first liquid 26. The control electronics 3, if needed, are preferably located in a pressure-compensated containment 25 inside of the housing 24. The housing 24 is directly exposed to seawater 22. It can be equipped with a volume compensator 29 giving the first liquid 26 a slight overpressure with respect to the surrounding seawater 22. In case of any leakage the differential pressure will prevent the seawater from entering the housing. The volume compensator 29 can be monitored as necessary.

A volume compensator 29 can also be used in embodiments that comprise a main vessel 21, such as the one described in FIG. 3. The volume compensator 29 is arranged normally on and alternatively inside the housing 24 then as described above. Additionally or alternatively, a volume compensator can be arranged inside the main vessel 21, outside of the housing 24.

The invention claimed is:

1. A variable speed drive (VSD) for subsea installations, comprising:
   an alternating current/alternating current converter;
   a liquid-tight housing in which at least the converter is arranged;
   wherein the housing is filled with an electrically isolating liquid; and
   a volume compensator provided for the housing;
   wherein the converter is equipped with power electronic switches, and wherein the converter is indirectly exposed to subsea environmental pressure, wherein the volume compensator provides the electrically isolating liquid with an overpressure with respect to a surrounding subsea pressure.

2. A variable speed drive (VSD) for subsea installations, comprising:
   an alternating current/alternating current converter;
   a liquid-tight housing in which at least the converter is arranged;
   wherein the housing is filled with an electrically isolating liquid; and
   a volume compensator provided for the housing;
   wherein the converter is equipped with power electronic switches, and wherein the converter is indirectly exposed to subsea environmental pressure, wherein a differential pressure between an interior of the housing and an exterior of the housing is negligible.

3. The variable speed drive of claim 1, wherein the electrically isolating liquid acts as a coolant to dissipate waste heat from electronics of the converter.

4. The variable speed drive of claim 1, wherein the alternating current/alternating current converter has a current-controlled capacitor-less direct current link.

5. The variable speed drive of claim 4, wherein the direct current link comprises a smoothing inductor.

6. The variable speed drive of claim 4, wherein the direct current link consists of a smoothing inductor.

7. The variable speed drive of claim 1, wherein a wall of the housing has a thickness of maximally 10 mm.

8. The variable speed drive of claim 1, wherein the housing is directly exposed to seawater.

9. The variable speed drive of claim 1, wherein the housing is arranged within a liquid-tight main vessel.

10. The variable speed drive of claim 9, wherein the main vessel is at least partially filled with the electrically isolating liquid or another electrically isolating liquid.

11. The variable speed drive of claim 1, wherein the converter comprises a thyristor-controlled rectifier and a thyristor-controlled line-commutated inverter.

12. A variable speed drive (VSD) for subsea installations, comprising:
   an alternating current/alternating current converter;
   a liquid-tight housing in which at least the converter is arranged;
   wherein the housing is filled with an electrically isolating liquid; and
   a volume compensator provided for the housing;
   wherein the converter is equipped with power electronic switches, and wherein the converter is indirectly exposed to subsea environmental pressure, further comprising a separate air-filled containment comprising control electronics of the converter.

13. The variable speed drive of claim 12, wherein the air-filled containment is arranged inside the housing.

14. A variable speed drive (VSD) for subsea installations, comprising:
- an alternating current/alternating current converter;
- a liquid-tight housing in which at least the converter is arranged;
- wherein the housing is filled with an electrically isolating liquid; and
- a volume compensator provided for the housing;
- wherein the converter is equipped with power electronic switches, and wherein the converter is indirectly exposed to subsea environmental pressure, wherein the volume compensator is located on or inside the housing.

15. The variable speed drive of claim 1, wherein the power electronic switches are selected from the group consisting of thyristors, metal oxide semiconductor field effect transistors, and insulated gate bipolar transistors.

16. A subsea installation, comprising:
- a variable speed drive (VSD) comprising:
- an alternating current/alternating current converter;
- a liquid-tight housing in which at least the converter is arranged;
- wherein the housing is filled with an electrically isolating liquid; and
- a volume compensator provided for the housing;
- wherein the converter is equipped with power electronic switches, and wherein the converter is indirectly exposed to subsea environmental pressure, wherein a differential pressure between an interior of the housing and an exterior of the housing is negligible.

17. A variable speed drive (VSD) for subsea installations, comprising:
- an alternating current/alternating current converter;
- a liquid-tight housing in which at least the converter is arranged;
- wherein the housing is filled with an electrically isolating liquid; and
- a volume compensator for the housing, the volume compensator configured to provide a pressure inside said housing substantially similar to a subsea environmental pressure when the variable speed drive is installed subsea;
- wherein the converter is equipped with power electronic switches and is disposed in the electrically isolating liquid in the housing, such that the converter and the power electronic switches are indirectly exposed to the subsea environmental pressure.

18. The variable speed drive of claim 17, wherein the converter comprises a power electronic switch-controlled rectifier and a power electronic switch-controlled line-commutated inverter.

19. The variable speed drive of claim 17, wherein the power electronic switches are selected from the group consisting of thyristors, metal oxide semiconductor field effect transistors, and insulated gate bipolar transistors.

* * * * *